(12) United States Patent
Koskiniemi et al.

(10) Patent No.: US 7,916,086 B2
(45) Date of Patent: Mar. 29, 2011

(54) ANTENNA COMPONENT AND METHODS

(75) Inventors: Kimmo Koskiniemi, Oulu (FI); Vesa Kuronen, Oulu (FI)

(73) Assignee: Pulse Finland Oy, Kempele (FI)

( * ) Notice: Subject to any disclaimer, the term of this patent is extended or adjusted under 35 U.S.C. 154(b) by 568 days.

(21) Appl. No.: 11/801,894

(22) Filed: May 11, 2007

(65) Prior Publication Data

US 2008/0007459 A1 Jan. 10, 2008

Related U.S. Application Data

(63) Continuation of application No. PCT/FI2005/050382, filed on Oct. 27, 2005.

(30) Foreign Application Priority Data

Nov. 11, 2004 (FI) .................................... 20041455

(51) Int. Cl.
*H01Q 1/38* (2006.01)
(52) U.S. Cl. ................. 343/700 MS; 343/846
(58) Field of Classification Search ........... 343/700 MS, 343/702, 846
See application file for complete search history.

(56) References Cited

U.S. PATENT DOCUMENTS

| | | | |
|---|---|---|---|
| 4,069,483 A | 1/1978 | Kaloi | |
| 5,157,363 A | 10/1992 | Puurunen | |
| 5,281,326 A | 1/1994 | Galla | |
| 5,298,873 A | 3/1994 | Ala-Kojola | |
| 5,349,700 A | 9/1994 | Parker | |
| RE34,898 E | 4/1995 | Turunen | |
| 5,408,206 A | 4/1995 | Turunen | |
| 5,506,554 A | 4/1996 | Ala-Kojola | |
| 5,521,561 A | 5/1996 | Yrjola | |
| 5,550,519 A | 8/1996 | Korpela | |
| 5,675,301 A | 10/1997 | Nappa | |
| 5,764,190 A | 6/1998 | Murch et al. | |
| 5,892,490 A | 4/1999 | Asakura et al. | |

(Continued)

FOREIGN PATENT DOCUMENTS

EP 0 376 643 A2 4/1990

(Continued)

OTHER PUBLICATIONS

Wong, K., et al.; "A Low-Profile Planar Monopole Antenna for Multiband Operation of Mobile Handsets"; IEEE Transactions on Antennas and Propagation, Jan. '03, vol. 51, No. 1.

(Continued)

*Primary Examiner* — Tho G Phan
(74) *Attorney, Agent, or Firm* — Gazdzinski & Associates, PC

(57) ABSTRACT

An antenna component suited for small-sized radio devices for forming a dielectric antenna. A small auxiliary circuit board (210) is used for the matching of the antenna, the matching being based on a conductor pattern on it. A substrate chip (220), on the surface of which the radiator is, and the auxiliary board are fastened to each other, whereby the radiator is electrically connected to said conductor pattern. The radiator, its substrate and the auxiliary board form a unitary, solid antenna component (200), which is mounted on the circuit board (PWB) of the radio device. The antenna with its feed and matching circuits can be designed and tested as a whole of its own, in which case the reproducibility is good. In the design of the circuit board of the radio device, the antenna needs to be taken into account only by reserving a space for the antenna component on the circuit board.

45 Claims, 3 Drawing Sheets

U.S. PATENT DOCUMENTS

| | | | |
|---|---|---|---|
| 5,903,820 | A | 5/1999 | Hagstrom |
| 5,986,614 | A * | 11/1999 | Suesada et al. ............... 343/752 |
| 6,133,879 | A | 10/2000 | Grangeat et al. |
| 6,147,650 | A | 11/2000 | Kawahata |
| 6,177,908 | B1 | 1/2001 | Kawahata et al. |
| 6,195,049 | B1 | 2/2001 | Kim et al. |
| 6,281,848 | B1 * | 8/2001 | Nagumo et al. ....... 343/700 MS |
| 6,323,811 | B1 | 11/2001 | Tsubaki |
| 6,639,559 | B2 * | 10/2003 | Okabe et al. ........... 343/700 MS |
| 6,683,573 | B2 | 1/2004 | Park |
| 6,781,545 | B2 | 8/2004 | Sung |
| 6,950,066 | B2 | 9/2005 | Hendler et al. |
| 7,026,994 | B2 * | 4/2006 | Ikuta et al. ............. 343/700 MS |
| 7,099,690 | B2 | 8/2006 | Milosavljevic |
| 7,126,546 | B2 | 10/2006 | Annamaa |
| 7,136,019 | B2 | 11/2006 | Mikkola |
| 7,148,851 | B2 | 12/2006 | Takaki et al. |
| 7,352,326 | B2 | 4/2008 | Korva |
| 2002/0145569 | A1 | 10/2002 | Onaka |
| 2002/0149538 | A1 * | 10/2002 | Tomomatsu et al. ......... 343/895 |
| 2002/0196192 | A1 | 12/2002 | Nagumo et al. |
| 2003/0020659 | A1 | 1/2003 | Kushihi |
| 2003/0092420 | A1 | 5/2003 | Sugimoto et al. |
| 2004/0090382 | A1 | 5/2004 | Kushihi et al. |
| 2005/0024272 | A1 | 2/2005 | Ponce De Leon et al. |
| 2005/0078037 | A1 | 4/2005 | Leclerc et al. |
| 2005/0078038 | A1 * | 4/2005 | Takaki et al. ................. 343/702 |
| 2005/0243001 | A1 | 11/2005 | Miyata et al. |
| 2006/0145924 | A1 | 7/2006 | Chen et al. |
| 2007/0152885 | A1 | 7/2007 | Sorvala |
| 2007/0171131 | A1 | 7/2007 | Sorvala |
| 2007/0241970 | A1 | 10/2007 | Thornell-Pers |

FOREIGN PATENT DOCUMENTS

| | | |
|---|---|---|
| EP | 0 749 214 | 12/1996 |
| EP | 0 759 646 A1 | 2/1997 |
| EP | 0 766 341 | 2/1997 |
| EP | 0 766 340 | 4/1997 |
| EP | 0 831 547 A2 | 3/1998 |
| EP | 0 942 488 A2 | 9/1999 |
| EP | 1 003 240 A2 | 5/2000 |
| EP | 1 063 722 A2 | 12/2000 |
| EP | 1 102 348 | 5/2001 |
| EP | 1 113 524 | 7/2001 |
| EP | 1 128 466 A2 | 8/2001 |
| EP | 1 139 490 | 10/2001 |
| EP | 1 146 589 | 10/2001 |
| EP | 1 162 688 | 12/2001 |
| EP | 1 248 316 | 9/2002 |
| EP | 1 267 441 | 12/2002 |
| EP | 1 351 334 | 8/2003 |
| EP | 1 361 623 | 11/2003 |
| EP | 1 414 108 | 4/2004 |
| EP | 1 432 072 | 6/2004 |
| EP | 1 445 822 | 8/2004 |
| EP | 1 453 137 | 9/2004 |
| EP | 1 469 549 | 10/2004 |
| EP | 1 482 592 | 12/2004 |
| EP | 1 544 943 | 6/2005 |
| JP | 03 280625 | 12/1991 |
| JP | 7249923 | 9/1995 |
| JP | 10 028013 | 1/1998 |
| JP | 10 209733 | 8/1998 |
| JP | 11 004117 | 1/1999 |
| JP | 11 068456 | 3/1999 |
| JP | 11 355033 | 12/1999 |
| JP | 2001217631 | 10/2001 |
| JP | 2002319811 A | 10/2002 |
| JP | 2004112028 | 4/2004 |
| JP | 2004363859 | 12/2004 |
| JP | 2005005985 | 1/2005 |
| KR | 10-2006-7027462 | 12/2002 |
| WO | WO 00/36700 | 6/2000 |
| WO | WO 01/28035 | 4/2001 |
| WO | WO 01/33665 | 5/2001 |
| WO | WO 02/11236 A1 | 2/2002 |
| WO | WO 02/078123 | 10/2002 |
| WO | WO 2004/070872 | 8/2004 |
| WO | WO 2004/100313 | 11/2004 |
| WO | WO 2004/112189 A | 12/2004 |
| WO | WO 2005/011055 | 2/2005 |
| WO | WO 2005/018045 | 2/2005 |
| WO | WO 2005/038981 A1 | 4/2005 |
| WO | WO 2005/055364 | 6/2005 |
| WO | WO 2006/000631 A1 | 1/2006 |
| WO | WO 2006/000650 | 1/2006 |

OTHER PUBLICATIONS

O. Kivekäs, et al.; "Frequency-tunable internal antenna for mobile phones", Proceedings of 12émes Journées Internationales de Nice sur les Antennes, 12$^{th}$ Int'l Symposium on Antennas (JINA 2002), vol. 2, 2002, Nice, France, s.53-56, tiivistelmä.

* cited by examiner

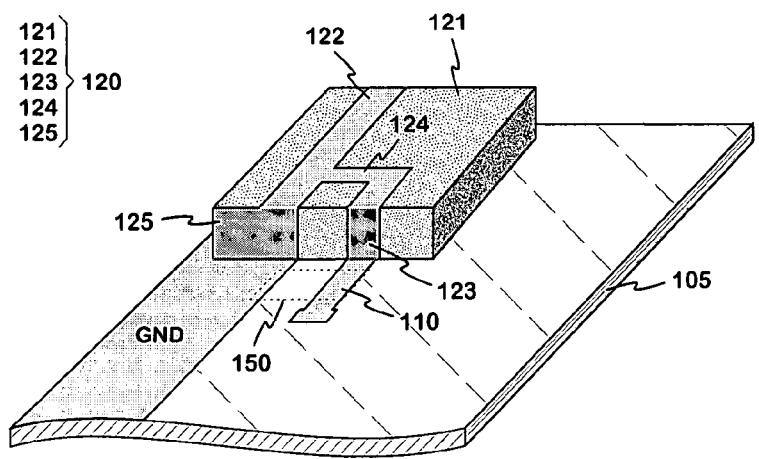
Fig. 1        PRIOR ART
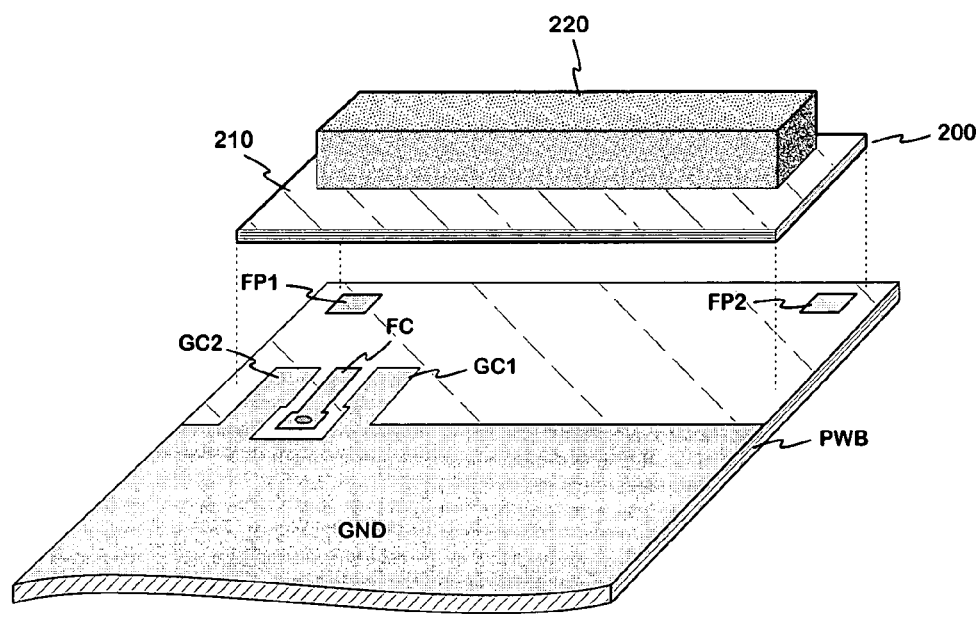
Fig. 2

ANTENNA COMPONENT AND METHODS

PRIORITY AND RELATED APPLICATIONS

This is a continuation application of and claims priority to International PCT Application No. PCT/FI2005/050382 having an international filing date of Oct. 27, 2005, which claims priority to Finland Patent Application No. 20041455 filed Nov. 11, 2004, each of the foregoing incorporated herein by reference in its entirety. This application is related to co-owned U.S. Pat. No. 7,589,678, issued Sep. 15, 2009 and entitled "Multi-Band Antenna With a Common Resonant Feed Structure and Methods", and co-owned U.S. Pat. No. 7,663,551, issued Feb. 16, 2010 and entitled "Multiband Antenna Apparatus and Methods", each also incorporated herein by reference in its entirety. This application is also related to co-owned U.S. Pat. No. 7,786,938, issued Aug. 31, 2010 and entitled "Antenna, Component And Methods", and U.S. Pat. No. 7,679,565, issued Mar. 16, 2010 and entitled "Chip Antenna Apparatus and Methods", both of which are incorporated herein by reference in their entirety.

COPYRIGHT

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

The invention relates to an antenna component suited for small-sized radio devices for forming a dielectric antenna.

BACKGROUND OF THE INVENTION

In small-sized radio devices, such as mobile phones, the antenna must also be small. For reducing the size of the antenna, already for a long time, the whip of a monopole antenna has been replaced by a coil-like helix conductor or arranged in bends to form a meander pattern, for example. However, for comfort of use, the antenna is by choice placed inside the cover of the device. Internal antennas usually have a planar structure, in which case they include a radiating plane and a ground plane at certain distance therefrom. The space taken by the planar antenna depends on the size of the radiator and its distance from the ground plane. In order to reduce the size of the antenna, this distance can be made very small, but a harmful result of this is the deterioration of the electric characteristics of the antenna. The electric size of the radiator is determined by the operating frequency of the antenna. When the premise is an air-insulated antenna, favorable efficiency-wise, the physical size of the radiator and the size of the whole antenna as well can be reduced by a dielectric substrate. This means that there is a substantially lot of material with relatively high dielectricity between the radiator and the ground plane. The smaller size is achieved at the cost of increased losses of the antenna, but the increase can be kept reasonable by the choosing of materials.

In this description and the claims, an antenna which has a conductor radiator with a dielectric substrate as described above is called a "dielectric antenna". Numerous of dielectric antennas with somewhat different structures are known. An example of a dielectric antenna according to FIG. 1 is known from the publication EP 0766 340. It includes a circuit board 105 of a radio device, where a part of the upper surface of the circuit board belongs to the conductive ground plane GND. On the circuit board there is a rectangular dielectric piece 121, which functions as the substrate of the radiator. The radiator and its feed and short-circuit have been implemented by coating the substrate 121 with conductive material. The radiator 122 is a strip running across the upper surface of the substrate in its longitudinal direction. The feed conductor of the radiator is formed of a first portion 110 on the surface of the circuit board 105, a second portion 123 on the end surface of the substrate and a third portion 124 on the upper surface of the substrate. The third portion joins to the radiator at a radiator intermediate point. The head end of the radiator 122 is connected to the ground GND through the short-circuit conductor 125 on the above mentioned end surface of the substrate. At its tail end, the radiator can continue to the second end surface of the substrate, not visible in FIG. 2, and extend on it close to the ground on the circuit board 105 for further reducing the size of the antenna. The substrate 121 with its conductive coating forms a unitary antenna component 120, which, as connected to the circuit board, together with it constitutes the whole antenna.

The impedance of the antenna according to FIG. 1 is matched by means of a short-circuit conductor 120 and by choosing the joining point of the feed conductor to the radiator. However, the matching can be unsatisfactory in a part of the operating band of the antenna, in which case it is necessary to use separate matching components, in addition, in the feed circuit of the antenna. An area 150 on the circuit board 105, on which matching components can be connected, is drawn with a dotted line in FIG. 1. Discrete matching components increase the production costs of the antenna. In addition, the reproducibility of the antenna unit is poor because of the tolerances of the component values. This results in a need to tune the antenna, which again has its own practical difficulties.

SUMMARY OF THE INVENTION

An object of the invention is to reduce the above mentioned drawbacks of the prior art. An antenna component according to the invention is characterized in what is set forth in the independent claim 1. Some preferred embodiments of the invention are set forth in the other claims.

In one aspect of the invention, a small auxiliary circuit board is used for the matching of a dielectric antenna, in which case the matching is based on a conductor pattern on it. A substrate chip, on the surface of which the radiator is located, and the auxiliary board are fastened to each other, whereby the radiator is electrically connected to said conductor pattern. The radiator, its substrate and the auxiliary board form a unitary, solid antenna component, which is mounted on the circuit board of the radio device.

The invention has the advantage that almost the entire antenna with its feed and matching circuits can be designed and tested as a whole of its own. This results in good reproducibility and better performance of the antenna compared to the situation that parts of the antenna structure would be on the circuit board of the radio device. In addition, the invention has the advantage that the design of the circuit board of the radio device is simplified, because the antenna matching need not be taken into account in it. What is required is only to reserve a space for the antenna component on the board and to provide contact surfaces on the board for connecting the antenna component. Furthermore, the invention has the advantage that possible later changes in the antenna are relatively simple and cheap, because the main circuit board of the radio device need not be renewed. A further advantage of the invention is that the auxiliary circuit board of the antenna component can also function as an integration base for possible additional components having an effect on the operation of the antenna. In addition, the invention has the advantage that the antenna is small as compared e.g. to an air-insulated planar antenna operating in the same frequency range.

In another aspect of the invention an antenna component useful as part of an antenna is disclosed. In one embodiment, the antenna comprises a dielectric antenna, and the component comprises: at least one radiation element having a dielectric substrate and an antenna radiator; and an auxiliary board comprising a conductor pattern adapted to feed the radiator and to match the antenna, the conductor pattern comprising an antenna feed conductor and at least one ground conductor disposed substantially proximate the feed conductor for connection to a signal ground. The radiation element is fastened to the auxiliary board, the radiator being electrically coupled to the conductor pattern.

In one variant, the auxiliary board comprises a single layer circuit board, or alternatively a multi-layer circuit board.

In another variant, the at least one ground conductor comprises two conductors, one on each side of the feed conductor and at substantially the same level therewith.

In still another variant, the at least one ground conductor comprises two conductors, one disposed at least partly above the feed conductor, and the other disposed at least partly below the feed conductor.

In yet a different variant, a majority portion of the radiator is disposed on a front surface of the radiation element, and the radiator is galvanically connected both to the feed conductor and the at least one ground conductor. The radiator also extends to an upper surface of the radiation element.

In another variant, at least one discrete component is located on the auxiliary board and influences at least one characteristic of the antenna. The discrete component comprises e.g., a switch coupled electrically between the radiator and the signal ground.

In yet another variant, the at least one radiation element comprises at least two radiation elements disposed substantially on the auxiliary board.

Alternatively, the at least one radiation element comprises two radiation elements each having radiators located symmetrically to one other, their resonance frequencies being substantially equal.

As yet another alternative, the at least one radiation element comprises at least two radiation elements each having radiators, the resonance frequencies of the radiators being unequal to one another so as to provide at least one of: (i) a widened operating band of the antenna, and (ii) separate operating bands associated with respective ones of the radiators.

In still another variant, a majority portion of the radiator is disposed substantially on an upper surface of the radiation element, and a ground plane is formed on the auxiliary board substantially below the radiation element.

The radiation element may fastened to the auxiliary board by at least soldering, by an adhesive, and/or lamination.

In another variant, the dielectric substrate comprises at least some ceramic material.

In yet another variant, the components further comprises conductor pads disposed on a lower surface of the antenna component, the pads being adapted to permit fastening of the component by soldering.

In another embodiment, the component comprises at least one radiation piece with a dielectric substrate and an antenna radiator on its surface. The antenna component further comprises an auxiliary board with a conductor pattern to feed the radiator and to match the antenna, the conductor pattern comprising an antenna feed conductor and at least one ground conductor disposed substantially alongside it to be connected to signal ground. The radiation piece is permanently fastened to the auxiliary board, the radiator then being electrically coupled to the conductor pattern.

In yet another aspect of the invention, a dielectric antenna is disclosed. In one embodiment, the antenna comprises: at least one radiation element having a dielectric substrate and an antenna radiator; a signal ground; and a substrate element comprising a conductor pattern adapted to feed the antenna radiator and to match the antenna, the conductor pattern comprising an antenna feed conductor and at least one ground conductor disposed substantially proximate the feed conductor for connection to the signal ground. The radiation element is fastened to the substrate element, the antenna radiator being electrically coupled to the conductor pattern.

In still another aspect of the invention, a mobile telephony device is disclosed. In one embodiment, the device comprises: telephony apparatus; and a dielectric antenna in signal communication with the telephony apparatus, the antenna comprising: at least one radiation element having a dielectric substrate and an antenna radiator; a signal ground; and a substrate element comprising a conductor pattern adapted to feed the antenna radiator and to match the antenna, the conductor pattern comprising an antenna feed conductor and at least one ground conductor disposed substantially proximate the feed conductor for connection to the signal ground. The radiation element is fastened to the substrate element, the antenna radiator being electrically coupled to the conductor pattern.

In one variant, the device further comprises a cover, and the dielectric antenna comprises a substantially planar antenna disposed within the cover.

In a further aspect of the invention, a dielectric antenna for use in a mobile device having a circuit board is disclosed. In one embodiment, the antenna comprises: a substrate having a conductor pattern disposed thereon; a radiator element; a substrate chip fastened to the substrate, the radiator element being disposed substantially on the surface of the chip. The radiator element is electrically coupled to the conductor pattern.

In one variant, the substrate is used for the matching of the dielectric antenna, the matching based at least in part on the conductor pattern. The radiator element, the substrate chip, and the substrate form a substantially unitary antenna component which is mounted on the circuit board.

In another embodiment, the dielectric antenna is assembled according to the method comprising: providing a substrate; forming a conductor pattern on the substrate; providing a radiator element; providing a substrate chip; fastening the chip to the substrate; disposing the radiator element substantially on the surface of the chip; and electrically coupling the radiator element to the conductor pattern.

In yet another embodiment, the dielectric antenna is matched according to the method comprising: providing a substrate having a conductor pattern formed thereon; providing a substrate chip with a radiator element disposed thereon; fastening the chip to the substrate; electrically coupling the radiator element to the conductor pattern; and matching the antenna based at least in part on the conductor pattern.

In yet a further embodiment, the antenna comprises: a substrate having a conductor pattern disposed thereon; a radiator element; a substrate chip fastened to the substrate, the radiator element being disposed substantially on the surface of the chip. The radiator element is electrically coupled to the conductor pattern, and the radiator element, the substrate chip, and the substrate form a substantially unitary antenna component which can be designed and tested substantially as a unit.

BRIEF DESCRIPTION OF THE DRAWINGS

In the following, the invention will be described in more detail. Reference will be made to the accompanying drawings, in which FIG. 1 presents an example of a prior art dielectric antenna, FIG. 2 is a general, schematic drawing of an antenna component according to the invention.

DETAILED DESCRIPTION OF THE INVENTION

Figure 3A:
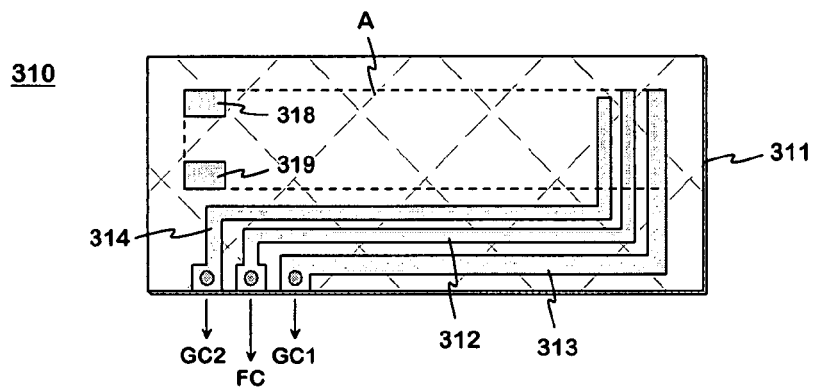
FIG. 3a shows an example of an auxiliary board belonging to an antenna component according to the invention.

FIG. 2 is a schematic drawing of the principle of the antenna component according to the invention and of the circuit board of the radio device, on which circuit board the antenna component is intended to be mounted. The antenna component 200 is shown in the drawing above its mounting place. The antenna component has two main parts: an auxiliary board 210 and a radiation piece 220. The auxiliary board is a small circuit board, which is primarily for the matching of the antenna. The antenna conductors belonging to the auxiliary board form a conductor pattern, which is advantageous with regard to the matching. The antenna conductors can be on the surface of or inside the board. In the latter case, the auxiliary board is a multilayer board, which again can be based on ordinary circuit board material or it can be a ceramic board manufactured by the LTCC (Low Temperature Co-fired Ceramic) technique. The radiation piece comprises a dielectric chip and a conductor radiator on its surface. The dielectric chip, which in this drawing is elongated and rectangular, functions as a substrate for the radiator, increasing its electric size. The dielectric chip is made of some ceramic material, for example. The radiator is not shown in FIG. 2. The radiation piece 220 has been fastened to the auxiliary board 210 from one long side by soldering, for example, and therefore they form a unitary, solid antenna component. For soldering, there are conductor pads aligned to each other on the surfaces facing each other. The fastening can be strengthened by some adhesive material, when required. Fastening can also be carried out by laminating, in which case the ceramic radiation piece is pressed against the auxiliary board at a high temperature, until they have become glued to each other.

On the upper surface of the circuit board PWB of the radio device, there is seen the signal ground GND, the edge of which is at a certain distance from the antenna component when it is mounted. As extension of the signal ground, there are two parallel conductor strips GC1 and GC2 in FIG. 2, between which strips there is a conductor strip FC belonging to the antenna feed conductor. These three conductor strips extend below the antenna component for connecting the antenna component to the radio device. The connecting can take place by soldering, for example, whereby the solder joints also serve to fasten the antenna component to the circuit board PWB. In addition, there can be conductor strips on the circuit board merely for fastening the antenna component, such as the conductor pads FP1 and FP2 in FIG. 2. In that case, there are similar conductor pads on the lower surface of the antenna component, of course.

FIG. 3a shows an example of an auxiliary board belonging to an antenna component according to the invention as seen from above. The auxiliary board 310 corresponding to the auxiliary board 210 in FIG. 2 comprises a relatively thin rectangular dielectric board 311 with two conductor pads and three parallel conductor strips on its upper surface. The conductor pads 318 and 319 are for soldering the radiation piece on. The middle one of the conductor strips is the antenna feed conductor 312. On each side of it there is a ground conductor, the first ground conductor 313 and the second ground conductor 314. In the complete antenna, the feed conductor 312 is connected through the via of the auxiliary board to the extension FC of the feed conductor on the main circuit board PWB of the radio device, using the denotation of FIG. 2. Correspondingly, the first ground conductor 313 is connected to the ground strip GC1 of the circuit board PWB, and the second ground conductor 314 to the second ground strip GC2.

Together with the board 311, the strip conductors on the auxiliary board form the antenna feed line. The impedance of the feed line is determined by how the widths, mutual distances and the material of the board 311 have been chosen. The matching of the antenna again depends on the impedance of the feed line, and also its length. In the example of FIG. 3a, the parallel conductors of the feed line start from one long side of the auxiliary board close to one end of the board, run in the direction of the long side, turn close to the opposite end of the board to the direction of that end and extend close to the opposite long side of the board. The whole conductor pattern has been designed to realize good impedance matching when the feed line is at its tail end connected to a radiator of a certain kind, shown in FIG. 3b. So the feed line functions as the antenna matching circuit, at the same time. In FIG. 3a, an area A, to which the radiation piece according to the invention is fastened at its bottom, is marked with a broken line on the board 311. The tail ends of the conductors of the feed line run across the area A at its one end, and they also serve the fastening of the radiation piece when it is soldered in place. The above mentioned conductor pads 318 and 319 are at the opposite end of the area A.

The auxiliary board 311 of the example is a single layer board. When a multilayer board is used, one ground conductor can be placed above the feed conductor and one below it. In addition, there can be ground conductors on the level of the feed conductor. This increases the possibilities of finding a good matching and makes the feed, line of the antenna better shielded against external interferences.

Figure 3B:
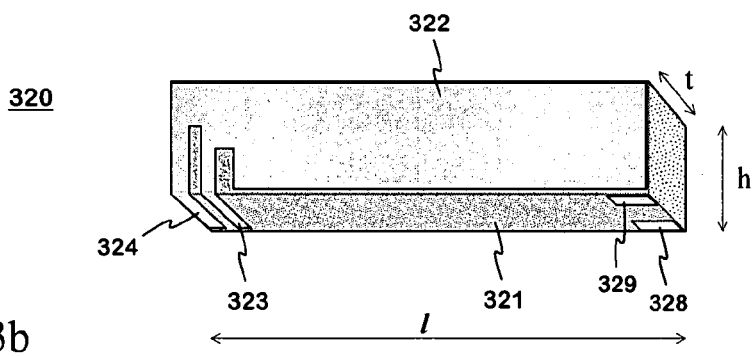
FIG. 3b presents an example of a radiating piece that fits the auxiliary board in FIG. 3a FIG. 4 shows another example of an auxiliary board belonging to an antenna component according to the invention.

FIG. 3b shows an example of a radiation piece belonging to the antenna component according to the invention, suitable for the auxiliary board shown in FIG. 3a. The radiation piece 320 comprises a planar radiator 322 and its substrate 321. The substrate is a dielectric chip shaped like a rectangular prism, the length of which is I, height h and thickness t. Of these, the length dimension is clearly the highest in this example. The radiation piece is placed against the auxiliary board of the antenna component from its bottom, which is one of the sides with the length I and width t. In this example, the radiator 322 covers the most part of one of the sides of the substrate with the length I and width h. The plane of the radiator is thus vertical, when the bottom is horizontal. In addition, the radiator can reach to some extent onto the upper surface or the end surface of the substrate in order to shape the radiation pattern.

The radiation piece 320 further comprises radiator connection strips. These include a first 323 and a second 324 connection strip. The second connection strip 324 is at one end of the bottom of the radiation piece in the direction of the end and continues to the side where the radiator is located, joining the radiator proper at the upper part of the end of the side in question. The first connection strip 323 is beside the second connection strip in the direction of the end of the bottom of the radiation piece and continues to the side where the radiator is located, joining the radiator proper there. When the radiation piece is placed on the auxiliary board 310 according FIG. 3a at the area A so that the radiator 322 comes to the opposite vertical surface of the piece as viewed from the feed line, the tail end of the feed conductor 312 of the feed line is connected to the first connection strip 323 and the first ground conductor 313 of the feed line is connected to the second connection strip 323. One end of the elongated radiator thus becomes connected to the ground, and the feed point of the radiator is close to that end. On the bottom of the radiation piece, at the opposite end as viewed from the connection strips 323 and 324, there are two conductor pads 328 and 329 for fastening the radiation piece. They are aligned at the conductor pads 318 and 319 of the auxiliary board, seen in FIG. 3a, when the radiation piece is set in place.

In this description and the claims, the "front surface" of the radiation piece means its surface on which the radiator is according to the above, i.e. the one of the vertical sides of the radiation piece that is furthest from the feed point of the antenna component. The qualifiers "upper" and "lower" refer to the position of the antenna component, in which the auxiliary board is horizontal.

Figure 4:
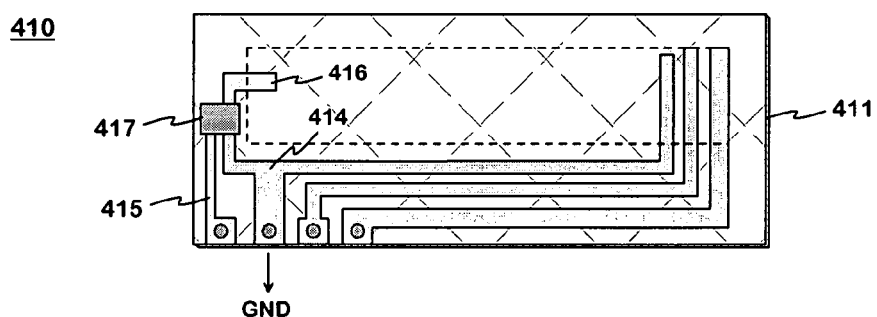

FIG. 4 shows another example of an auxiliary board belonging to the antenna component according to the invention as seen from above. The auxiliary board 410 has a similar feed and matching arrangement as in the board 310 shown in FIG. 3a. The difference compared to FIG. 3 is that there is an additional component 417 and its wiring on the auxiliary board 410. This wiring comprises a strip 415 for controlling the additional component, a strip connecting the additional component to the second ground conductor 414 of the auxiliary board, and a conductor strip 416 extending from the additional component below the radiation piece in the complete antenna component. From the conductor strip 416, there is a galvanic or electromagnetic coupling to some point of the radiator. The additional component ban be a switch, for example, in which case changing its state shifts the operating band of the antenna, for example.

Figure 5:
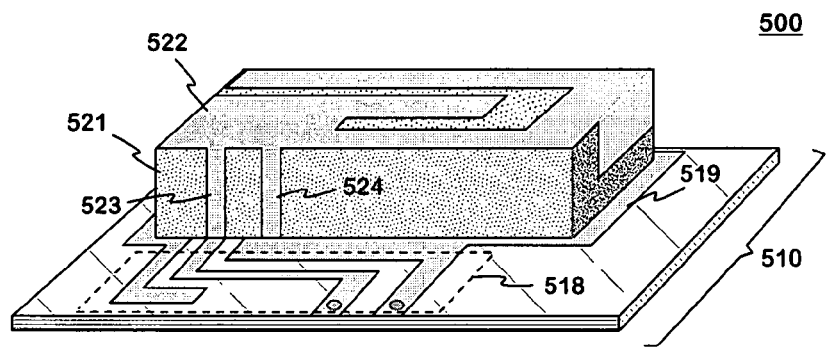
FIG. 5 presents another example of an antenna component according to the invention.

FIG. 5 shows another example of an antenna component according to the invention. The radiator 522 is now on the upper surface of the radiation piece, and on the auxiliary board 510 of the antenna component there is under the radiation piece a conductor plane 519 connected to the signal ground. The feed conductor 523 and also to a conductor 524 connecting the radiator to the conductor plane 519 join the radiator the whole antenna thus being of the PIFA type. The radiator has been shaped so that the antenna has two bands. There is also a conductor pattern 518 on the auxiliary board, which improves the matching of the antenna.

Figure 6:
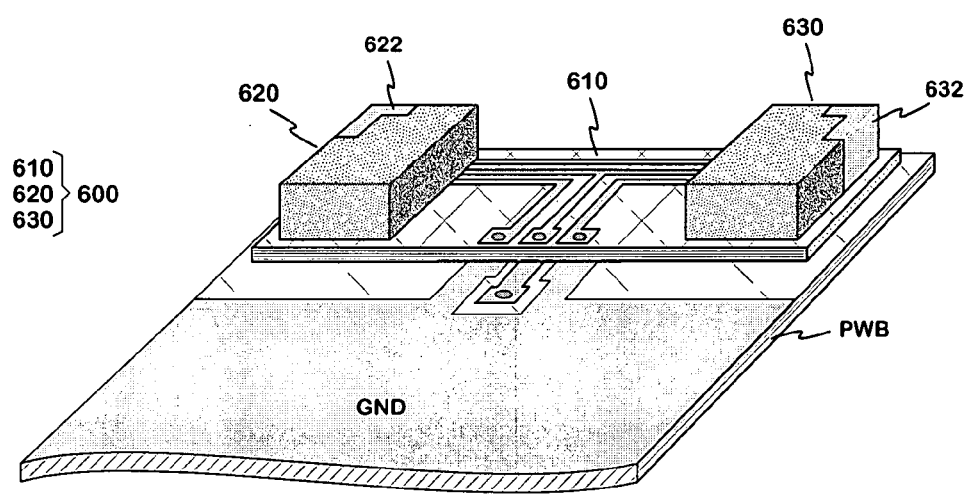
FIG. 6 presents a third example of an antenna component according to the invention.

FIG. 6 shows a third example of an antenna component according to the invention. On the auxiliary board 610 of the antenna component 600 there are now two radiation pieces, the first 620 and the second 630 radiation piece. These are located at the opposite ends of the auxiliary board. The antenna feed line is divided on the auxiliary board so that one branch leads to the first and another branch to the second radiation piece. The radiator 622 of the first radiation piece is largely on the front surface of the dielectric substrate, also extending to its outer side surface, as viewed from the centre of the auxiliary board, and to its upper surface. The radiator 632 of the second radiation piece is located symmetrically in respect of the first radiator 622.

In the above case, the resonance frequencies of the radiators are the same. When there are two or more radiation pieces, the radiators can also be tuned to different frequencies to widen the band or to form separate operating bands. In the latter case it helps if the dielectricities of the substrates of the radiators are selected suitably different.

An antenna component according to the invention has been described above. The details of its implementation can naturally differ from those presented. The shape of the conductor pattern of the radiator as well as the shape of the conductor pattern for the matching of the antenna can vary greatly. The inventive idea can be applied in different ways within the scope set by the independent claim 1.

The invention claimed is:

1. An antenna component for forming a dielectric antenna, which component comprises at least one radiation piece with a dielectric substrate and an antenna radiator on a surface of said substrate;
   wherein the antenna component further comprises an auxiliary board with at least one discrete component located thereon to influence the characteristics of the antenna, said discrete component comprising a switch coupled electrically between the radiator and the signal ground, said auxiliary board further comprising a conductor pattern to feed the radiator and to match the antenna, the conductor pattern comprising an antenna feed conductor and at least one ground conductor disposed substantially alongside it to be connected to signal ground; and
   wherein the radiation piece is permanently fastened to the auxiliary board, the radiator then being electrically coupled to said conductor pattern.

2. An antenna component according to claim 1, wherein said auxiliary board comprises a single layer circuit board.

3. An antenna component according to claim 1, wherein said auxiliary board comprises a multilayer circuit board.

4. An antenna component according to claim 1, a majority portion of the radiator being on a front surface of the radiation piece, and the radiator is galvanically connected both to the feed conductor and at least one ground conductor.

5. An antenna component according to claim 4, wherein the radiator also extends to an upper surface of the radiation piece.

6. An antenna component according to claim 1, wherein said dielectric substrate comprises ceramic material.

7. An antenna component for forming a dielectric antenna, which component comprises at least one radiation piece with a dielectric substrate and an antenna radiator on a surface of said substrate;
   wherein the antenna component further comprises an auxiliary board with a conductor pattern arranged to feed the radiator and to match the antenna, the conductor pattern comprising an antenna feed conductor and at least one ground conductor disposed substantially alongside it to be connected to signal ground;
   wherein the radiation piece is permanently fastened to the auxiliary board, the radiator then being electrically coupled to said conductor pattern; and
   wherein there are two radiation pieces on the auxiliary board with their radiators located symmetrically with respect to each other and their resonance frequencies being equal.

8. An antenna component according to claim 7, wherein a majority portion of the radiator is disposed on an upper surface of the radiation piece, and a ground plane is disposed on the auxiliary board below the radiation piece, the antenna component forming a planar antenna.

9. An antenna component according to claim 7, wherein the radiation piece is fastened to the auxiliary board by soldering.

10. An antenna component according to claim 9, wherein the radiation piece is further fastened to the auxiliary board by glueing.

11. An antenna component according to claim 7, wherein the radiation piece is fastened to the auxiliary board by laminating.

12. An antenna component according to claim 7, wherein said dielectric substrate comprises ceramic material.

13. An antenna component according to claim 7, further comprising conductor pads on a lower surface of the antenna component.

14. An antenna component for forming a dielectric antenna, which component comprises at least one radiation piece with a dielectric substrate and an antenna radiator on a surface of said substrate;
wherein the antenna component further comprises an auxiliary board with a conductor pattern to feed the radiator and to match the antenna, the conductor pattern comprising an antenna feed conductor and at least one ground conductor disposed substantially alongside it to be connected to signal ground;
wherein the radiation piece is permanently fastened to the auxiliary board, the radiator then being electrically coupled to said conductor pattern; and
wherein a majority portion of the radiator is disposed substantially on an upper surface of the radiation element, and a ground plane is formed on the auxiliary board substantially below the radiation element.

15. An antenna component according to claim 14, wherein said auxiliary board comprises a single layer circuit board.

16. An antenna component according to claim 14, wherein said auxiliary board comprises a multilayer circuit board.

17. An antenna component according to claim 16, wherein the radiation piece is fastened to the auxiliary board by soldering.

18. An antenna component according to claim 17, wherein the radiation piece further is fastened to the auxiliary board by glueing.

19. An antenna component according to claim 14, wherein at least one discrete component is located on the auxiliary board to influence the characteristics of the antenna.

20. An antenna component according to claim 19, wherein said at least one discrete component comprises a switch coupled electrically between the radiator and the signal ground.

21. An antenna component according to claim 14, wherein there are at least two radiation pieces on the auxiliary board.

22. An antenna component according to claim 21, the number of radiation pieces being two, and their radiators are located symmetrically to each other, their resonance frequencies being equal.

23. An antenna component according to claim 21, the resonance frequencies of the at least two radiation pieces being unequal in order to widen an operating band of the antenna or to form separate operating bands.

24. An antenna component according to claim 14, wherein the antenna component comprises a planar antenna.

25. An antenna component according to claim 14, wherein the radiation piece is fastened to the auxiliary board by soldering.

26. An antenna component according to claim 25, wherein the radiation piece is further fastened to the auxiliary board by glueing.

27. An antenna component according to claim 14, wherein the radiation piece is fastened to the auxiliary board by laminating.

28. An antenna component according to claim 14, wherein said dielectric substrate comprises ceramic material.

29. An antenna component according to claim 14, further comprising conductor pads on a lower surface of the antenna component.

30. An antenna component useful as part of a dielectric antenna, the component comprising:
at least one radiation element having a dielectric substrate and an antenna radiator; and
an auxiliary board comprising a conductor pattern adapted to feed the radiator and to match the antenna, the conductor pattern comprising an antenna feed conductor and at least one ground conductor disposed substantially proximate said feed conductor for connection to a signal ground;
wherein the radiation element is fastened to the auxiliary board, the radiator being electrically coupled to said conductor pattern; and
wherein at least one discrete component is located on the auxiliary board and influences at least one characteristic of the antenna, said discrete component comprising a switch coupled electrically between the radiator and the signal ground.

31. An antenna component according to claim 30, wherein said auxiliary board comprises a single layer circuit board.

32. An antenna component according to claim 30, wherein said auxiliary board comprises a multilayer circuit board.

33. An antenna component according to claim 30, wherein a majority portion of the radiator is disposed on a front surface of the radiation element, and the radiator is galvanically connected both to the feed conductor and the at least one ground conductor.

34. An antenna component according to claim 33, wherein the radiator also extends to an upper surface of the radiation element.

35. An antenna component according to claim 30, wherein said at least one radiation element comprises at least two radiation elements disposed substantially on the auxiliary board.

36. An antenna component according to claim 30, wherein said at least one radiation element comprises two radiation elements each having radiators located symmetrically to one other, their resonance frequencies being substantially equal.

37. An antenna component according to claim 30, wherein said at least one radiation element comprises at least two radiation elements each having radiators, the resonance frequencies of the radiators being unequal to one another so as to provide at least one of: (i) a widened operating band of the antenna, and (ii) separate operating bands associated with respective ones of the radiators.

38. An antenna component according to claim 30, wherein the radiation element is fastened to the auxiliary board by at least soldering.

39. An antenna component according to claim 38, wherein the radiation element is further fastened to the auxiliary board by an adhesive.

40. An antenna component according to claim 30, wherein the radiation element is fastened to the auxiliary board by at least lamination.

41. An antenna component according to claim 30, wherein said dielectric substrate comprises at least some ceramic material.

42. An antenna component according to claim 30, further comprising conductor pads on a lower surface of the antenna component, said pads being adapted to permit fastening of said component by soldering.

43. An antenna component useful as part of a dielectric antenna, the component comprising:
- a pair of radiation elements each having radiators located symmetrically to one other, their resonance frequencies being substantially equal, each of said pair of radiation elements having a respective dielectric substrate and an antenna radiator; and
- an auxiliary board comprising a conductor pattern adapted to feed the radiators and to match the antenna, the conductor pattern comprising an antenna feed conductor and at least one ground conductor disposed substantially proximate said feed conductor for connection to a signal ground;
- wherein each radiation element is fastened to the auxiliary board, and each radiator being electrically coupled to said conductor pattern.

44. An antenna component according to claim 43, a majority portion of each radiator being on a front surface of the respective radiation element and each radiator is galvanically connected both to the feed conductor and at least one ground conductor.

45. An antenna component according to claim 44, wherein each radiator also extends to an upper surface of its respective radiation piece.

* * * * *